United States Patent
Bieg

(10) Patent No.: US 6,640,452 B1
(45) Date of Patent: *Nov. 4, 2003

(54) BI-DIRECTIONAL PLANAR SLIDE MECHANISM

(75) Inventor: Lothar F. Bieg, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/225,111

(22) Filed: Aug. 20, 2002

Related U.S. Application Data

(62) Division of application No. 09/692,027, filed on Oct. 19, 2000, now Pat. No. 6,463,664.

(51) Int. Cl.[7] .......................... B43L 13/00; G01B 5/004
(52) U.S. Cl. .......................... 33/1 M; 33/32.5; 33/503; 33/26
(58) Field of Search .......................... 33/1 M, 503, 26, 33/32.1, 32.3, 32.4, 32.5

(56) References Cited

U.S. PATENT DOCUMENTS

| | | | | |
|---|---|---|---|---|
| 4,099,330 A | * | 7/1978 | Hicks et al. ................ 33/32.4 |
| 4,286,761 A | * | 9/1981 | Musgrove ................ 244/75 R |
| 4,421,997 A | * | 12/1983 | Forys .......................... 310/12 |
| 4,556,317 A | * | 12/1985 | Sandland et al. ........ 356/237.1 |
| 5,031,547 A | * | 7/1991 | Hirose .......................... 33/1 M |
| 5,477,743 A | * | 12/1995 | Yanagisawa ................ 33/1 M |
| 5,497,060 A | * | 3/1996 | Juergens, III ................ 33/1 M |
| 5,539,987 A | * | 7/1996 | Zennyoji ...................... 33/1 M |
| 5,858,587 A | * | 1/1999 | Yamane et al. ................ 430/22 |
| 6,176,018 B1 | * | 1/2001 | Wiklund ...................... 33/1 M |
| 6,510,614 B1 | * | 1/2003 | Kato et al. .................... 33/1 M |

* cited by examiner

Primary Examiner—Christopher W. Fulton
Assistant Examiner—Yanitza Guadalupe
(74) Attorney, Agent, or Firm—Robert D. Watson

(57) ABSTRACT

A bi-directional slide mechanism. A pair of master and slave disks engages opposite sides of the platform. Rotational drivers are connected to master disks so the disks rotate eccentrically about their respective axes of rotation. Opposing slave disks are connected to master disks on opposite sides of the platform by a circuitous mechanical linkage, or are electronically synchronized together using stepper motors, to effect coordinated motion. The synchronized eccentric motion of the pairs of master/slave disks compels smooth linear motion of the platform forwards and backwards without backlash. The apparatus can be incorporated in a MEMS device.

20 Claims, 15 Drawing Sheets

SEC. 1-1

SEC 1-1

BI-DIRECTIONAL PLANAR SLIDE MECHANISM

CROSS-REFERENCE TO RELATED APPLICATIONS

This application is a divisional application of U.S. patent application Ser. No. 09/692,027, "Multi-Axis Planar Slide System", by Lothar F. Bieg, filed Oct. 19, 2000, now U.S. Pat. No. 6,463,664 which is herein incorporated by reference.

FEDERALLY SPONSORED RESEARCH

The United States Government has rights in this invention pursuant to Department of Energy Contract No. DE-AC04-94AL85000 with Sandia Corporation.

BACKGROUND OF THE INVENTION

The present invention relates generally to mechanical positioning systems, and more specifically to linear slides and planar X-Y positioning mechanisms having essentially no backlash.

An important function of many of even the most basic mechanical devices is to move an item or mechanical element in a controlled manner. In many mechanical applications it is necessary to shift the position of an item in two-dimensional space, i.e. planar motion. The mechanical systems for accomplishing this task have commonly taken the form of slides, flexures, and multi-axis actuators of various types.

Historically, slides, flexures, and actuators are stacked on top of one another in order to move objects in multiple directions. For example, in a common X-Y stage, the Y-axis (e.g., "front-to-back") slide is carried on top of the X-axis (left-to-right) slide, providing independent, orthogonal two-dimensional motion in the X-Y plane. Typically, the drivers to move the slides mainly comprise a motor connected to a screw for converting rotary motion into linear displacement. The motor and screw effectuate rotational motion, with the pitch or lead of the screw being transformed into translational motion, which then is imparted to a slide element that moves to-and-fro upon associated guideways.

Conventional lead screw drives suffer from backlash upon reversal, resulting in reduced accuracy. Stacking one linear slide on top of the other can also reduce accuracy because the stacked structure is less compact, and, hence, less rigid.

Rapid progress currently is being made in the field of micro electro-mechanical systems (MEMS), where mechanical operations are performed by minutely sized machines. In current state of the art MEMS devices, drivers and actuators are generally planar elements. Single-axis (e.g. unidirectional) "comb" slides have been successfully fabricated with MEMS technology. A need remains, however, for a simple, planar X-Y stage fabricated with MEMS technology that provides positioning capability in two independent directions.

Against this background, the present invention was developed.

SUMMARY OF THE INVENTION

The invention relates to a planar apparatus for accurately positioning a movable platform in one or two dimensions. A sample or workpiece can be placed on top of the platform. A pair of master and slave disks engage opposing sides of the movable platform. Rotational driving means, such as geared motors, are connected to each disk at a location offset from the disk centers, so that the disks rotate eccentrically about the driver's axes of rotation. The pair of master and slave disks rotate in a coordinated fashion in the same direction. As the master disk rotates eccentrically, the distance between the axis of rotation and the platform's edge decreases. Simultaneously, the distance between the axis of rotation of the corresponding slave disk and the opposite edge of the platform increases by the same amount. The coordinated eccentric motion of the pairs of master/slave disks compels linear motion of the platform along an axis that is oriented parallel to a line connecting the two disk's axes of rotation. Smooth coordination of the pair of rotating master/slave disks eliminates backlash by keeping the disks in nearly continuous contact with the platform during movement. Coordination can be achieved, for example, by use of a timing belt, or by electronic synchronization of stepper motors.

Two-dimensional motion of the platform can be achieved by providing two pairs of coordinated master/slave disks, with each pair independently driving orthogonal X-axis and Y-axis motion. This arrangement provides all possible translational motion of the platform in a two-dimensional plane. The two pairs of coordinated master/slave disks can be placed on a single plane, thereby creating a planar X-Y stage. This planar geometry eliminates the need to stack the drive mechanisms on top of each other, making it well suited for MEMS applications. The maximum linear range of motion (e.g. stroke) along a single axis is equal to the largest radial distance from the disk's axis of rotation to its circumference.

BRIEF DESCRIPTION OF THE DRAWINGS

The accompanying drawings, which are incorporated into and form a part of the specification, illustrate several examples of the present invention and, together with the description, serve to explain the principles of the invention. The drawings are only for the purpose of illustrating a preferred embodiment of the invention and are not to be construed as limiting the invention. In the drawings.

DETAILED DESCRIPTION OF THE INVENTION

The invention relates to a highly accurate linear slide or planar X-Y stage having essentially no backlash. The present invention is adaptable to a variety of applications. For example, the invention can be used in macro setting as a movable X-Y worktable surface for a machine tool (e.g. drill press, milling machine). The invention can be used in mini-setting as an X-Y stage for positioning a specimen under a microscope. Finally, the apparatus is well suited in a micro-setting for incorporation as a planar X-Y stage into a MEMS device since the layers available to design and fabricate MEMS systems are somewhat limited.

In the fields of microscopy and optics, highly accurate 1-D and 2-D positioning devices are needed to control translational movement without play, backlash, or lost motion. Such devices often must perform in a vacuum environment, where grease and other lubricants are prohibited. The present invention does not require the use of lubricants, and due to its simplicity of construction lends itself to numerous mini and micro-scale applications. Additional applications for the invention could include repetitive motion mechanisms, since the apparatus translates a rotary motion into a reciprocating linear motion with a specific stroke. Conversion of rotation motion to translational displacement in the present invention is more direct than in other systems well known in the art. The apparatus can be manufactured in nearly any practical size, including but not limited to a micro size for inclusion in a MEMS device.

Figure 1:
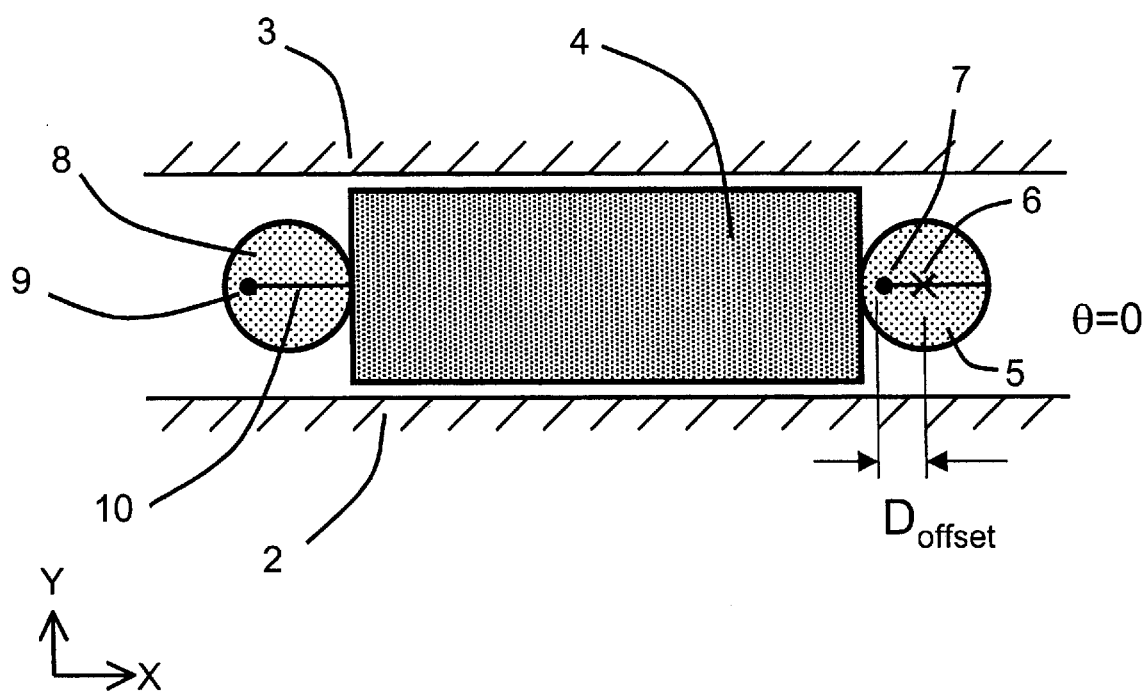
FIG. 1 illustrates a schematic top view of a first example of a single-axis slide mechanism, according to the present invention.

FIG. 1 illustrates a schematic top view of a first example of a single-axis slide mechanism, according to the present invention. Platform 4 slides back and forth along a single axis (e.g. X-axis), while being constrained by parallel guideway 2 and guideway 3. Guideways 2 and 3, or other means, prevent rotation of platform 4. Platform 4 can be constrained by linear bearing guides, air bearing means, or other well-known methods. Master disk 5 contacts the right end of platform 4. Rotational axis 7 is offset from the disk's centroid 6 a distance equal to $D_{offset}$. In a similar fashion, slave disk 8 contacts the opposite (e.g. left) end of platform 4. Slave disk 8 has a rotational axis 9, which is offset from its centroid. Axis of rotation 9 is also oriented substantially parallel to axis of rotation 7. Both axes of rotation 7 and 9 are oriented substantially parallel to the direction of motion (e.g. parallel to the X-Axis). The direction of motion of platform 4 coincides with a line (not shown) connecting axis of rotation 7 with axis of rotation 9.

Visualization line 10 is drawn simply to illustrate the orientation of the disks as they rotate; the line is not an element of the invention. Visualization line 10 is drawn between the axis of rotation and the disk's centroid. The shape of disks 5 and 8 can be circular, elliptical, polygonal, lobed, multi-lobed, oblong shapes. In this regard, the use of the word "disk" is very general, and encompasses not only circular shapes, but also those described previously. In all cases, the location of the disk's centroid must be offset from its axis of rotation in order to drive motion of platform 4. The preferred shape of the disks is circular. Preferably, the diameter of the master and slave disks are essentially the same.

Smooth linear motion (e.g. without backlash) of platform 4 is effected by rotating master disk 5 and slave disk 8 in the same direction, and in a coordinated manner. The amount of rotation is designated by the angle, θ. If the diameter of disks 5 and 8 are the same, then "coordinated rotation" means that both disks rotate at the same speed (e.g. rpm), and are synchronized (e.g. start and stop rotating at the same time). If the diameters of disks 5 and 8 are different, then each disk can rotate at a different speed from each other. The different rotation speed should be chosen appropriately to insure "coordinated motion", meaning that both the master and slave disks 5 and 8 should remain in contact with platform 4 to prevent problems with backlash. In either case (same, or different, diameters), the disk's rotation must also be synchronized (e.g. start and stop rotating at the same time) to effect smooth motion.

Figure 2:
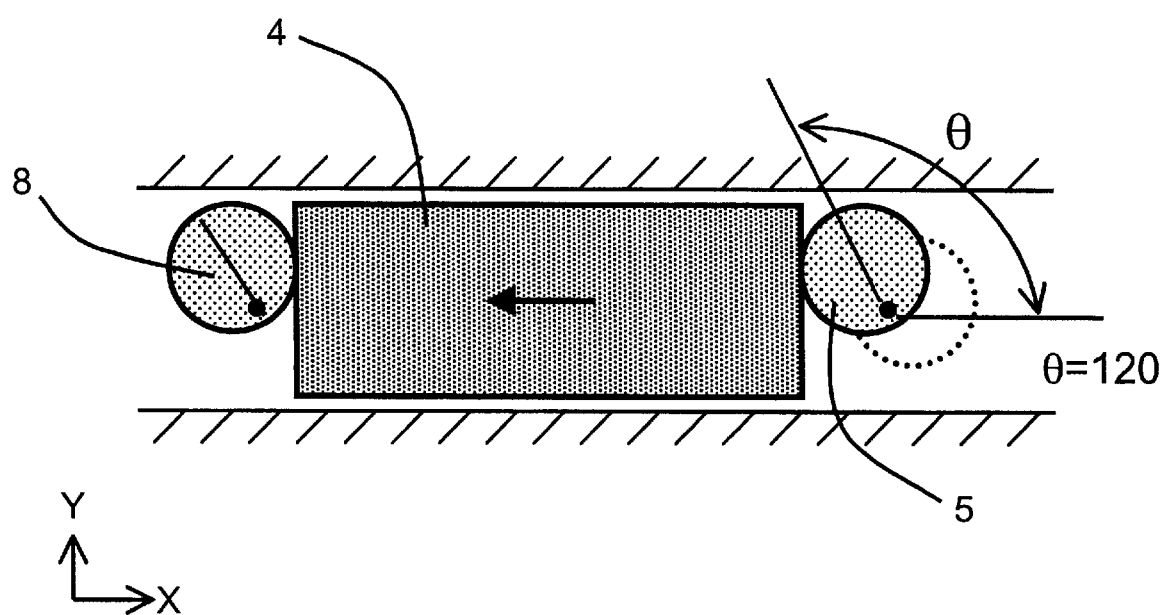
FIG. 2 illustrates a schematic top view of a first example of a single-axis slide mechanism, according to the present invention, when the disks have simultaneously rotated in the counter-clockwise direction by 120 degrees.

FIG. 2 shows that platform 4 has moved incrementally to the left when disks 5 and 8 have simultaneously rotated in the counter-clockwise direction by an amount equal to θ degrees (e.g. θ=120 degrees).

Figure 3:
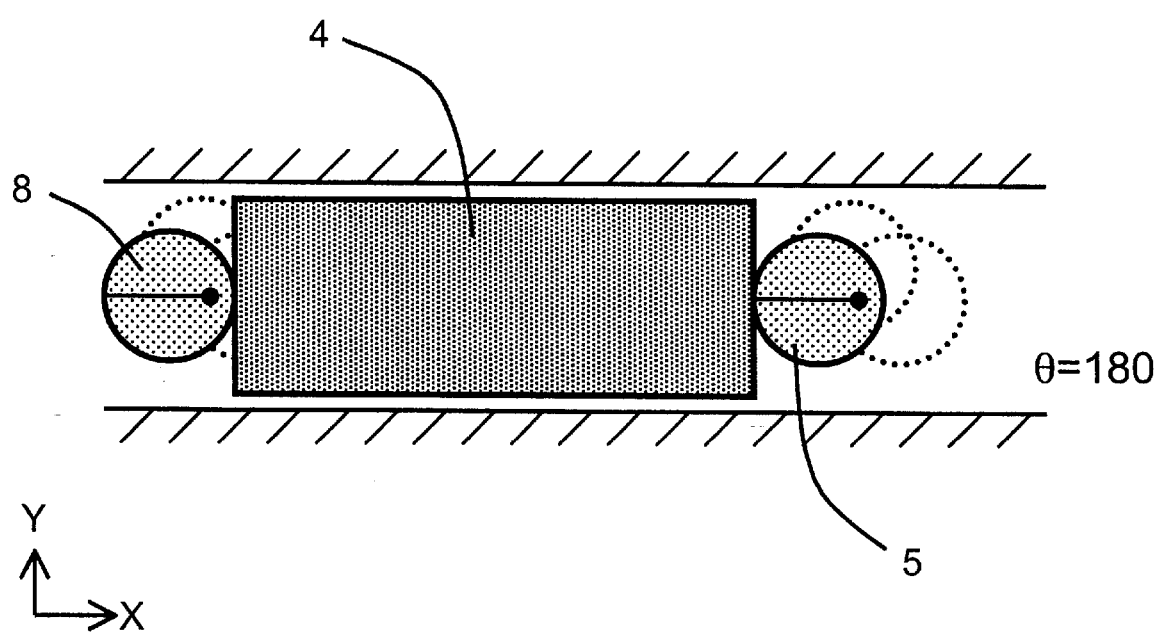
FIG. 3 illustrates a schematic top view of a first example of a single-axis slide mechanism, according to the present invention, when the platform has moved to its maximum displacement allowed by the geometry ($\theta=180$ degrees).
Figure 4:
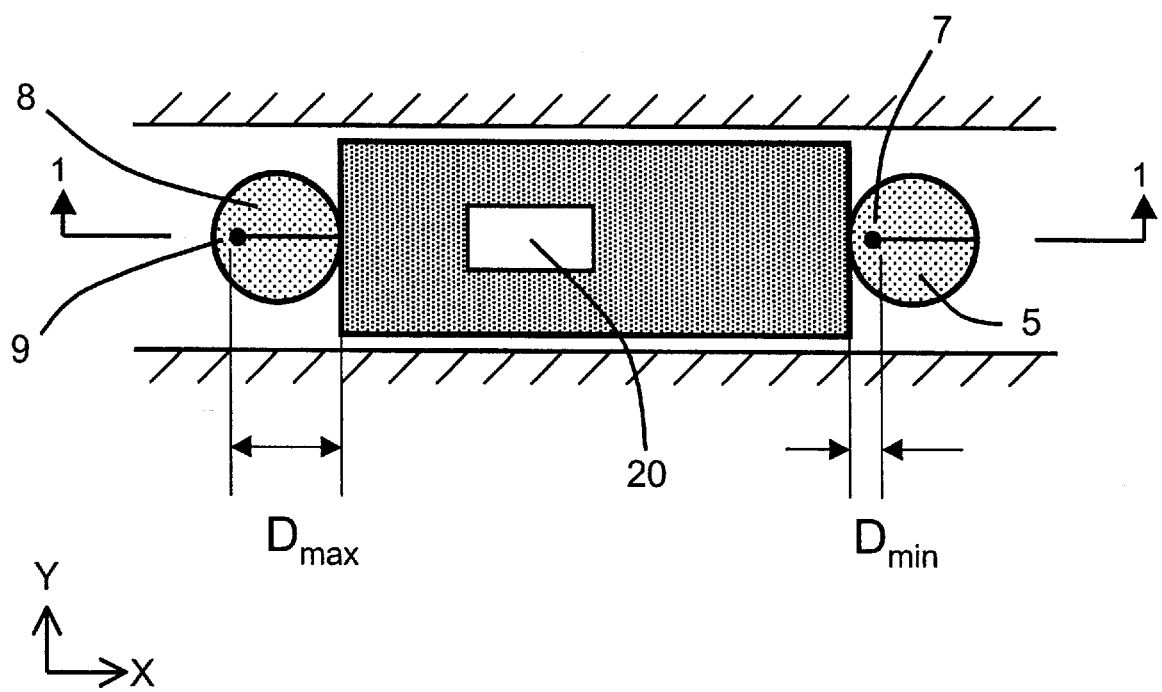
FIG. 4 illustrates a schematic top view of a first example of a single-axis slide mechanism, according to the present invention.

FIG. 3 shows that platform 4 has moved to its maximum displacement allowed by the geometry (θ=180 degrees). The maximum travel of a linear slide, according to the present invention, is equal to two times the offset distance, $D_{travel}=2 \times D_{offset}$. With reference to FIG. 4, we define $D_{max}$ as the maximum radial distance between the rotation axis 9 of slave disk 8 and the left end of platform 4. Likewise, we define $D_{min}$ as the minimum radial distance between the rotation axis 7 of master disk 5 and the opposite (e.g. right) end of platform 4. The maximum travel of platform 4, $D_{travel}$ is related to these distances by the following relationship: $D_{travel}=D_{max}-D_{min}$. Therefore, by increasing the eccentricity (e.g. offset) of the disks, the maximum travel of platform 4 also increases.

To minimize problems with backlash, and to make the overall motion as smooth as possible, it is important that when the radial distance between one axis of rotation (e.g. axis 9) and one side (e.g. left side) of the platform is at a maximum (e.g. $D_{max}$), then the distance between the other axis of rotation (e.g. axis 7) and the opposing side (e.g. right side) of the platform is at a minimum (e.g. $D_{min}$). This condition is illustrated in FIGS. 1 and 4.

Figure 5:
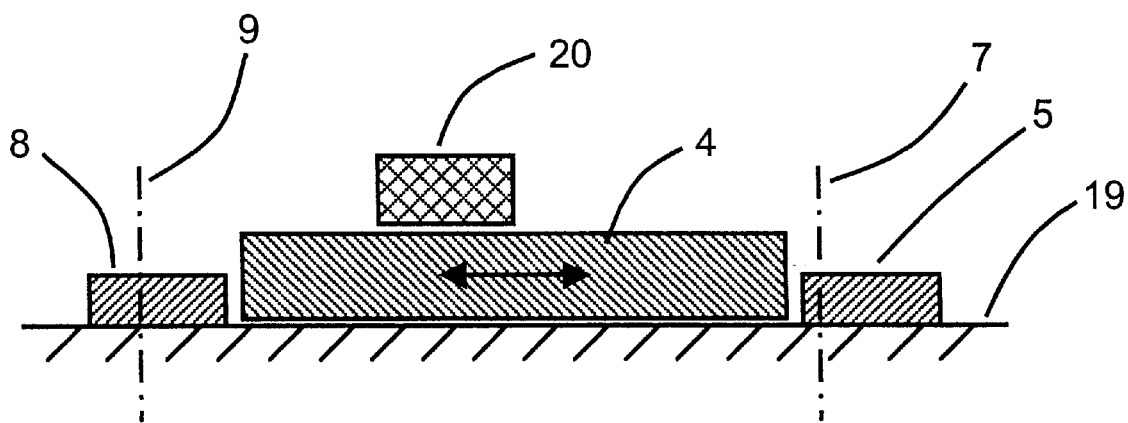
FIG. 5 shows a schematic cross-section view through the side of the example of a single-axis slide mechanism of FIG. 4.

FIG. 5 shows a schematic cross-section view through the side of the example of a single-axis slide mechanism of FIG.

4. Platform 4, master disk 5, and slave disk 8, lay in the same plane, designated as surface 19. Sample 20 is illustrated as lying on top of platform 4. Sample 20 can be clamped or attached to platform 4 using means well known in the art (not shown). Surface 19 represents the surface of a support base (not shown).

Figure 6:
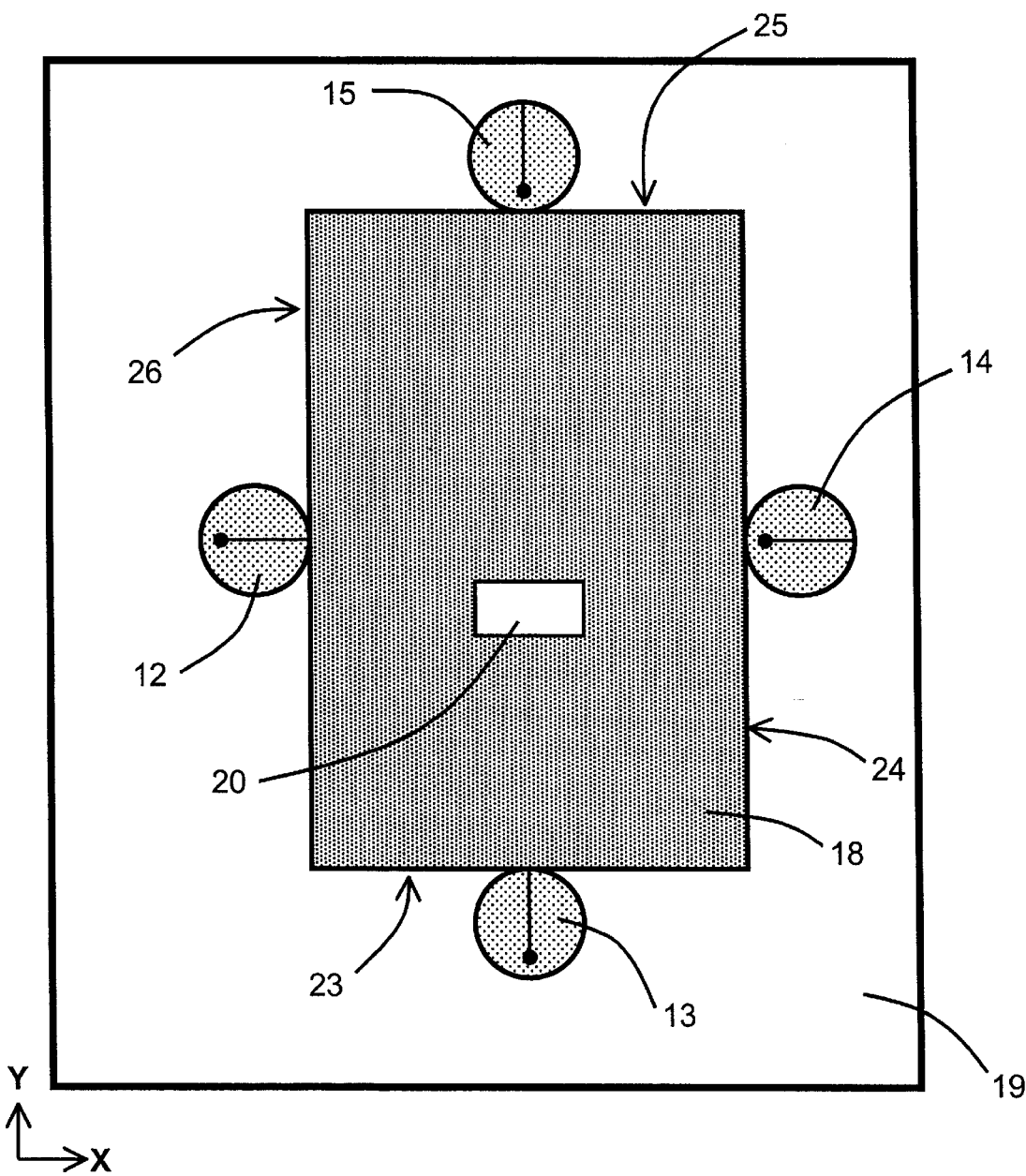
FIG. 6 illustrates a schematic top view of a first example of a planar X-Y stage (e.g. positioning mechanism), according to the present invention.

FIG. 6 illustrates a schematic top view of a first example of a planar X-Y stage (e.g. positioning mechanism), according to the present invention. Two pairs of disks 12 and 14; and 13 and 15 are operatively engaged with the four sides of platform 18 (e.g. sides 23, 24, 254, 26). More specifically, the circumferences or circumferential edge surfaces of the disks 12, 13, 14, 15 are in contact with surfaces, such as the sides, of platform 18 to be moved and positioned. Platform 18 can be square, rectangular, hexagonal, polygonal, circular, or other shape. Disks 12, 13, 14, 15 preferably are circular cylinders. Platform 18 can be of any size, but in the preferred embodiment is a rectangular or square planar element having four sides 23, 24, 25, and 26. Platform 18 can be slidably disposed upon, and supported by, a supporting surface 19. In this example, disks 12, 13, 14, and 15 are disposed outboard of platform 18. Sample 20 can be disposed on platform 18.

Referring still to FIG. 6, coordinated rotation in the same direction of X-axis master disk 12 and X-axis slave disk 14 produces smooth translational motion of platform 18 in the X-direction. Likewise, coordinated rotation in the same direction of Y-axis master disk 13 and Y-axis slave disk 15 produces smooth translational motion of platform 18 in the Y-direction. It is not necessary for the direction of rotation be the same between the two pairs of disks. For example, X-axis master/slave disks 12, 14 can both be rotating clockwise, while Y-axis master/slave disks 13, 15 can both be rotating counter-clockwise. However, it is necessary for the pair of master and slave disks to both rotate in the same direction to effect coordinated motion.

Figure 7:
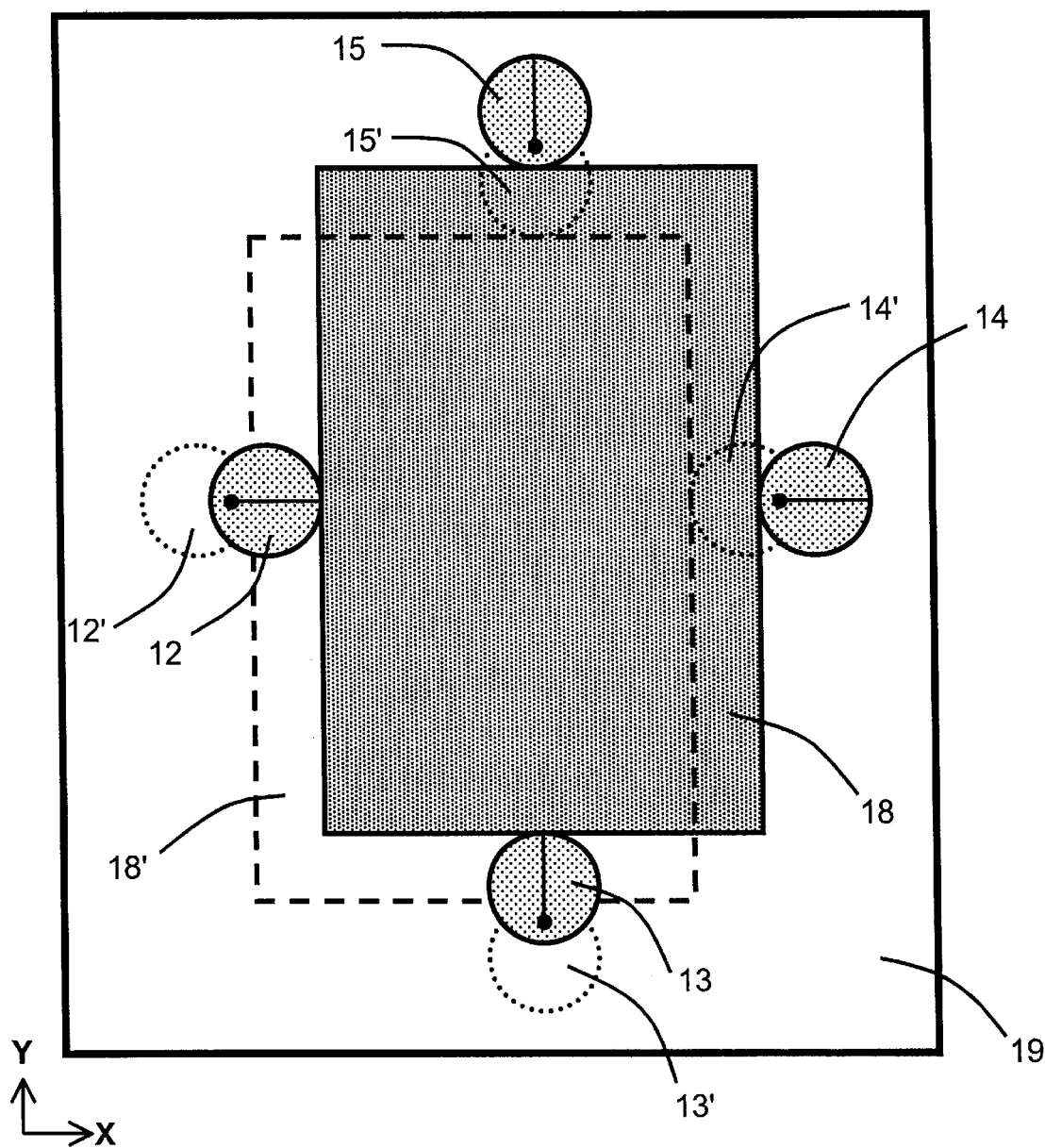
FIG. 7 illustrates, by way of dotted outline 18', the final position of platform 18 (from FIG. 6) after it has been moved the maximum possible distance in both X and Y directions.

FIG. 7 illustrates, by way of dotted outline 18', the final position of platform 18 (from FIG. 6) after it has been moved the maximum possible distance in both X and Y directions. Coordinated rotation of the X-axis master/slave pair of disks (12 and 14) has linearly moved platform 18 to its maximum travel in the X-direction. Likewise, coordinated rotation of the Y-axis master/slave pair of disks (13 and 15) has linearly moved platform 18 to its maximum travel in the Y-direction. It will be appreciated that independent action of each of the X-axis and Y-axis master/slave disk pairs, when combined, can generate all possible translational motion of platform 18 in a two-dimensional plane.

Figure 8:
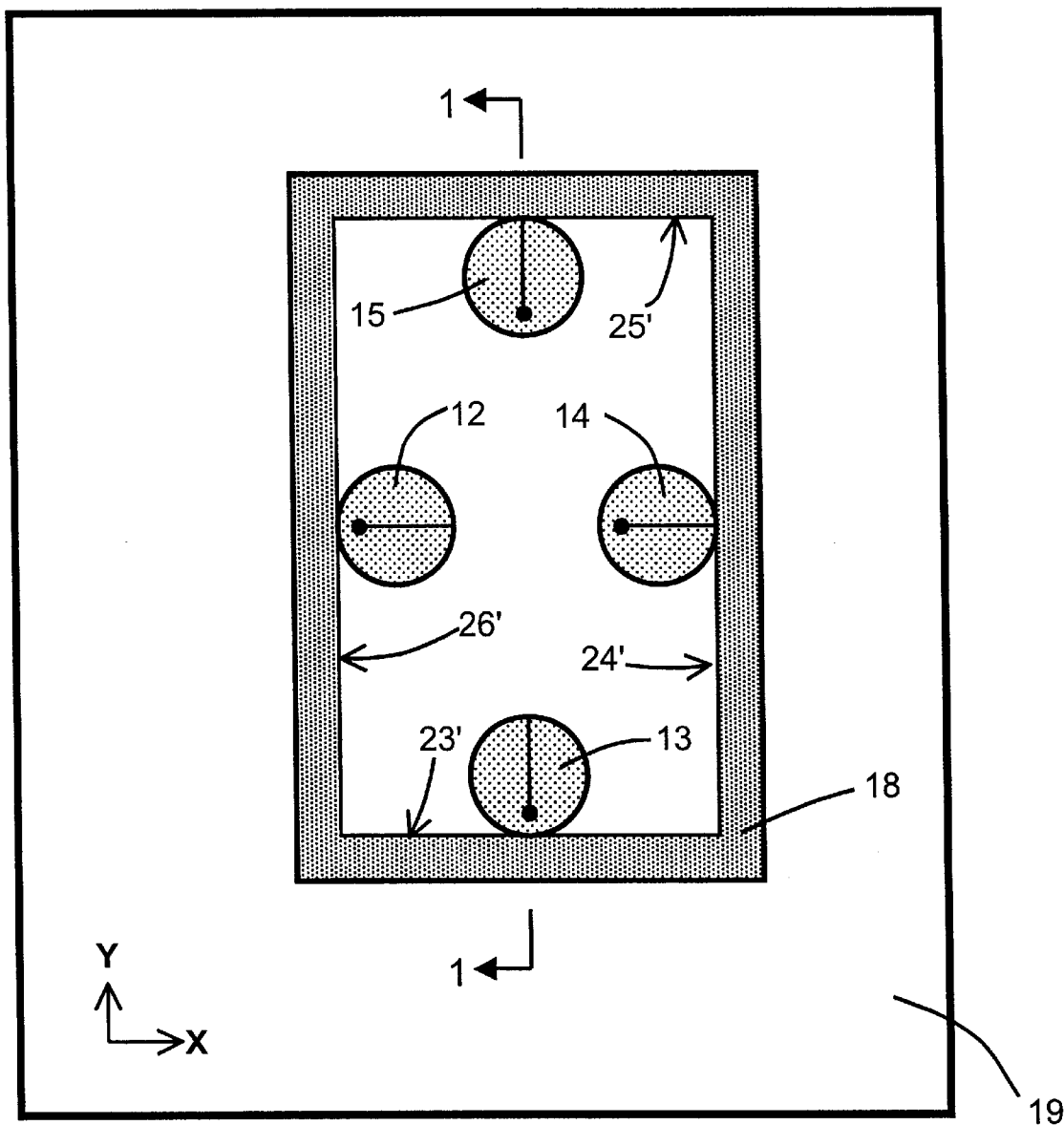
FIG. 8 illustrates a bottom view of a second schematic example of a planar X-Y positioning apparatus.
Figure 9:
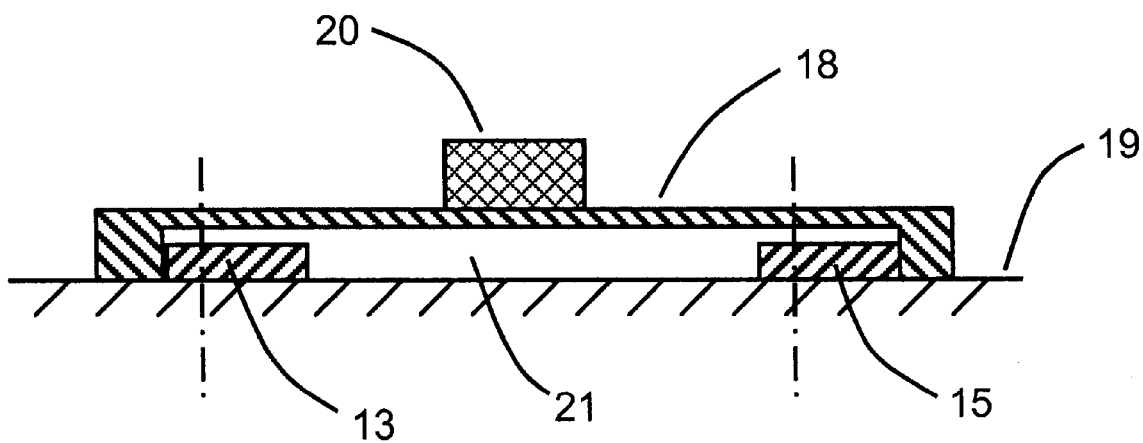
FIG. 9 shows a schematic side view of the cross-section of the apparatus of FIG. 8.

FIG. 8 illustrates a bottom view of a second schematic example of a planar X-Y positioning apparatus. The four disks (12, 13, 14, and 15) are disposed inboard of the perimeter of platform 18. Disks 12, 13, 14, and 15 operatively engage with inside surfaces 23', 24', 25', and 26', respectively, of platform 18. With reference now to FIG. 9, which shows a schematic side view of the cross-section of the apparatus of FIG. 8, platform 18 has a recessed space 21 that houses disks 13 and 15. In this configuration, sample 20 is isolated by platform 18 from possible contamination by optional lubricants in disks 12, 13, 14, and 15, and their associated drivers (to be discussed later). Also, disks 12, 13, 14, and 15, and their associated drivers, are shielded by platform 18 from possible contamination due to operations performed on sample 20 (e.g. machining fluids, chips, etc.)

Figure 10:
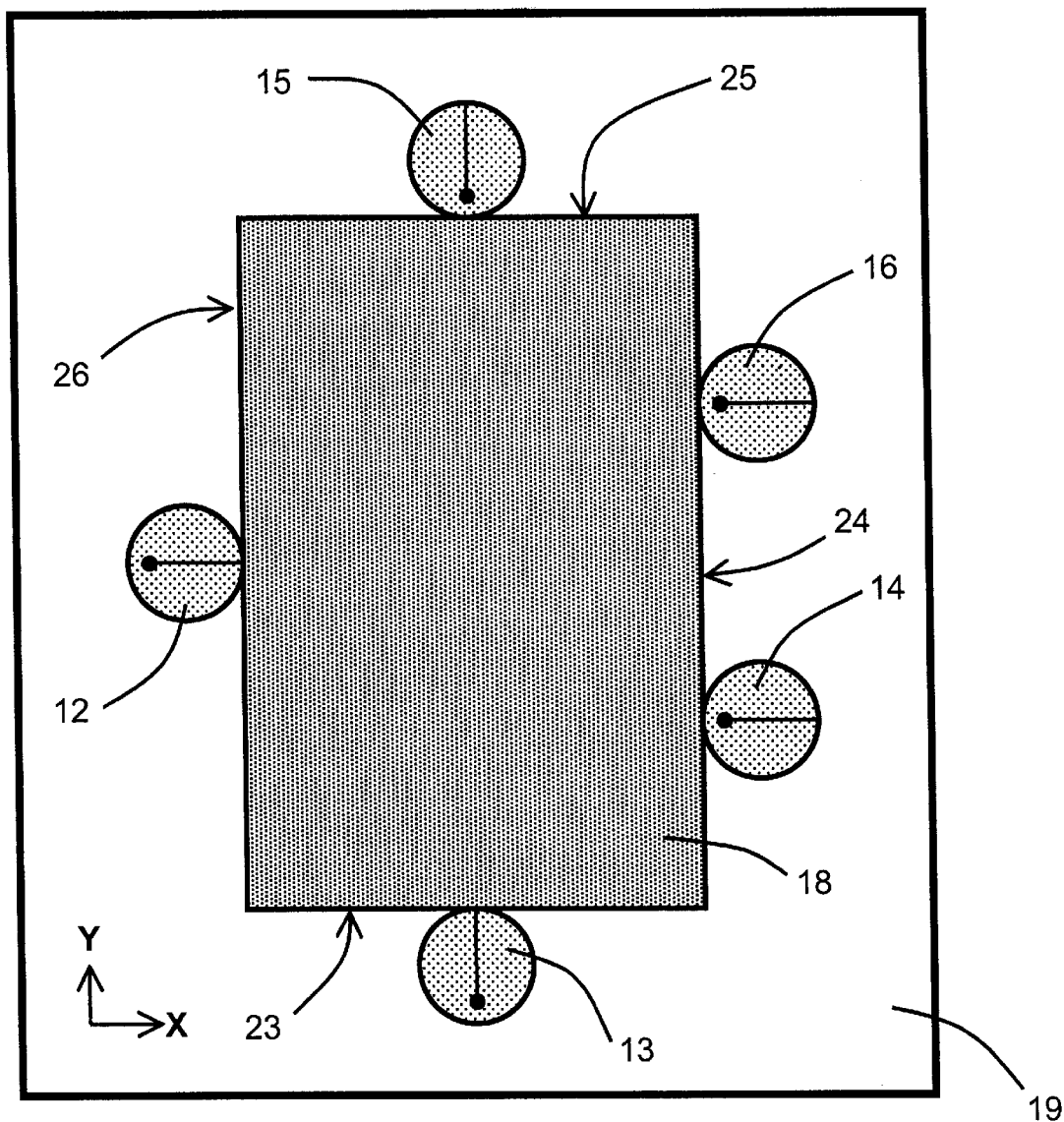
FIG. 10 illustrates a schematic top view of a third example of a planar X-Y positioning mechanism.

FIG. 10 illustrates a schematic top view of a third example of a planar X-Y positioning mechanism. In this example, X-axis motion of platform 18 is compelled by coordinated rotation of three disks: X-axis master disk 12, first X-axis slave disk 14 and second X-axis slave disk 16. Disk 12 contacts side 26, while disks 14 and 16 contact the opposite side 24. The combination of the three X-axis disks 12, 14, and 16 creates a kinematic constraining action on platform 18 that serves to eliminate positional errors due to small rotations of platform 18 about its centroid (not shown). Coordinated rotation of these three disks produces smooth translational motion in the X-direction without backlash, and without rotation of platform 18 about its centroid.

Figure 11:
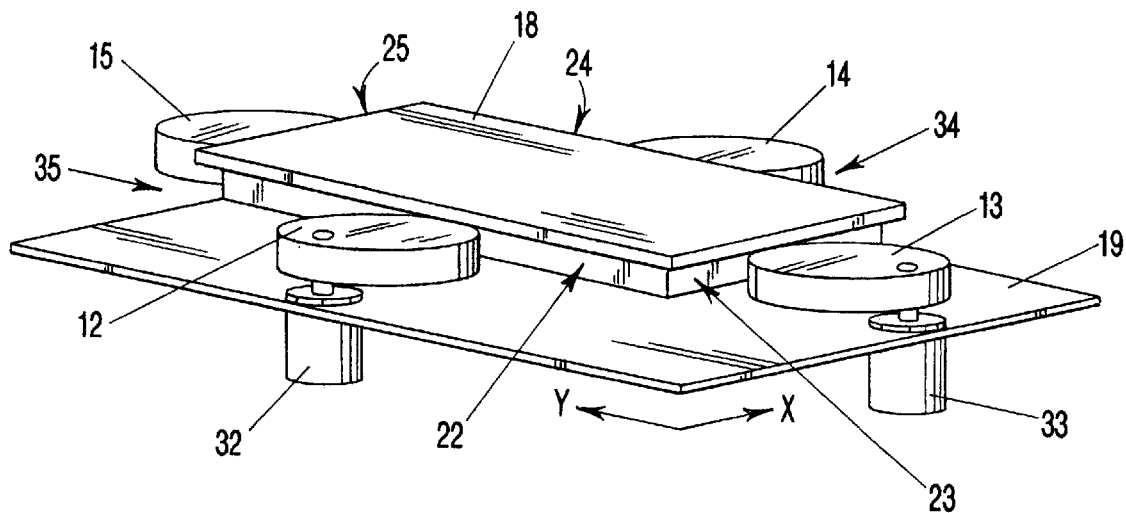
FIG. 11 illustrates a schematic isometric view of a fourth example of a planar X-Y stage, according to the present invention.

FIG. 11 illustrates a schematic isometric view of a fourth example of a planar X-Y stage, according to the present invention. Rotational drivers 32, 33, 34, 35, extend through the plane 19, and are fixedly connected to disks 12, 13, 14, 15, respectively, at positions offset from the centroids of the respective disks. Accordingly, as drivers 32, 33, 34, and 35 rotate, disks 12, 13, 14, and 15 also rotate, creating eccentric rotational motion. Drivers 32, 33, 34, 35, can be driven by motors, stepper motors, or manual cranks; with or without gear trains.

Coordinated rotation of the master/slave pair of disks is required to produce smooth translational motion of platform 18 along a given axis. Consequently, this requires coordinated operation of the disks respective drivers. In FIG. 11, opposing disks 12 and 14 are paired together for X-axis motion. Therefore, opposing drivers 32 and 34 are also paired together. Opposing paired drivers 32, 34 (or, alternatively, 33 and,35) can be electronically synchronized by known means.

Figure 12:
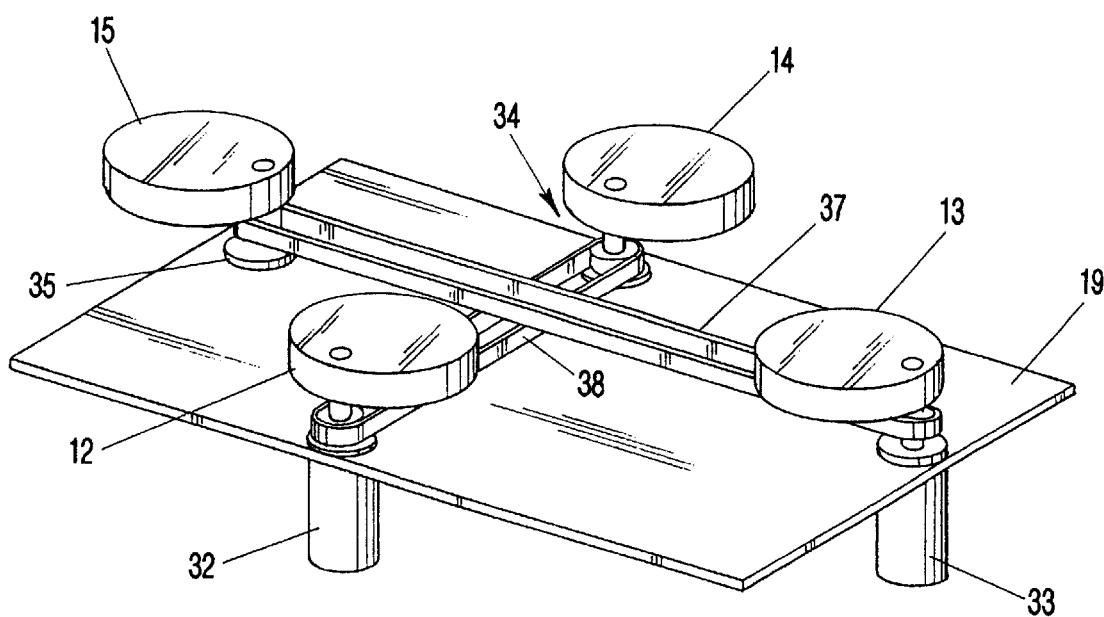
FIG. 12 illustrates a schematic isometric view of a fifth example of an X-Y stage.

FIG. 12 illustrates a schematic isometric view of a fifth example of an X-Y stage. Platform 18 is not shown for clarity of illustration of the drive assembly. Opposing pairs of drivers 32, 34 (or, alternatively, 33 and 35) can be operatively connected by means of a timing belt, drive chain, drive belt, or gear train. In this example, driving belts 38 operatively connects drivers 32 and 34 to produce synchronized rotation of disks 12 and 14. Likewise, drive belt 37 operatively connects drivers 33 and 35 to produce synchronized rotation of disks 13 and 15. Drive belts 37, 38 can as well be other connection components, such as chains, toothed timing belts, flexible steel bands, O-rings, or the like. Gear trains also could be employed.

For a MEMS version of the present invention, a minimum of a one micron (0.001 mm) gap or clearance is required between mating surfaces due to design constraints inherent to MEMS technology.

To minimize friction, and associated torques, between the circumferential surfaces of the disks 12, 13, 14, 15 sliding along the sides 22, 23, 24, 25 of platform 18, lubricants or bearings can be employed. The use of roller, needle, or ball bearing assemblies can provide a rolling contact point having very low effective friction, thereby minimizing the need to use lubricants.

Figure 13:
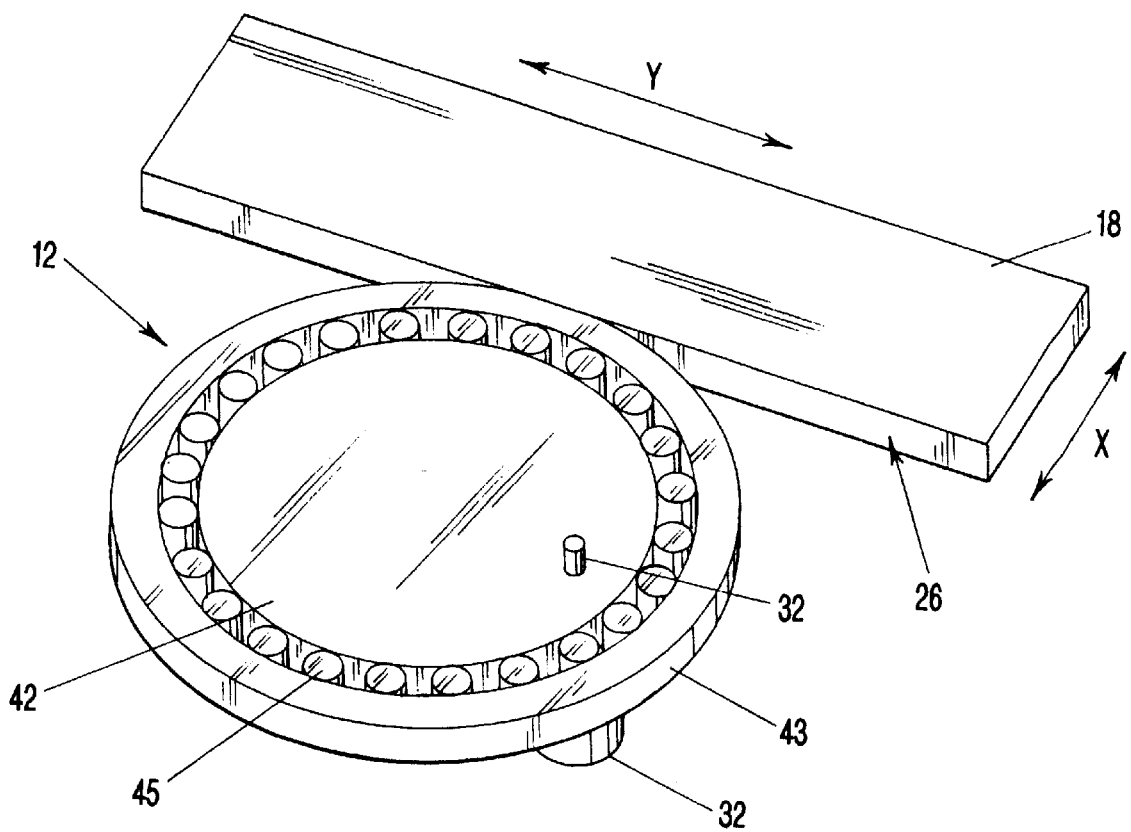
FIG. 13 illustrates a schematic isometric view of disk 12, including a bearing assembly, according to the present invention.

FIG. 13 illustrates a schematic isometric view of disk 12, including a bearing assembly, according to the present invention. Eccentric disk 12 is concentric to, and is in contact, with an inner race 42 of a ball, roller, or needle bearing assembly, while an outer race 43 makes contact with the side 26 of platform 18. An essentially identical bearing assembly can be used with the other disks 13, 14, 15. FIG. 13 illustrates the preferred type of bearing assembly, incorporating a plurality of needle bearings 45 radially disposed between races 42 and 43. The entire bearing assembly can be sealed.

In the example of FIG. 13, motion of platform 18 only in the Y-direction produces rotation of outer race 43, while the inner race 42 remains stationary. Alternatively, motion of platform 18 only in the X-direction produces rotation of outer race 43 and counter-rotation of inner race 43. A combination of both X and Y-axis motion results in rotations of both the inner and outer races 42, 43.

During initial assembly of an X-Y stage, the distance between the master disks 12, 13 and respective slave disks 14, 15 should be adjusted to correspond closely to the dimensions of platform 18, so as to reduce or eliminate any play, backlash, or lost motion between the platform and the disks. An example of an initial configuration of disks can be seen in FIG. 6, with reference to the visualization lines. Here, the disks are so disposed such that when the centroid of a master disk (e.g. disk 12) is between its axis of rotation and the platform, then the axis of rotation of the paired slave disk (e.g. disk 14) is between the centroid of the slave disk and the opposite end of the platform. Once the maximum radial distance between the axis of rotation of a given disk (e.g. master disk 12) and the platform 18 is reached, the distance between the axis of rotation of the opposing disk (e.g. slave disk 14) and the platform is at its minimum. Small adjustments can be made in the width of platform 18 to precisely achieve this kinematic condition. The physical relationship between the master disks 12, 13 and their corresponding slave disks 14, 16 compels this condition, allowing for coordinated disk motion. Therefore, by proper initial alignment of the disks, problems with backlash can be minimized and the overall accuracy can be improved.

Figure 14:
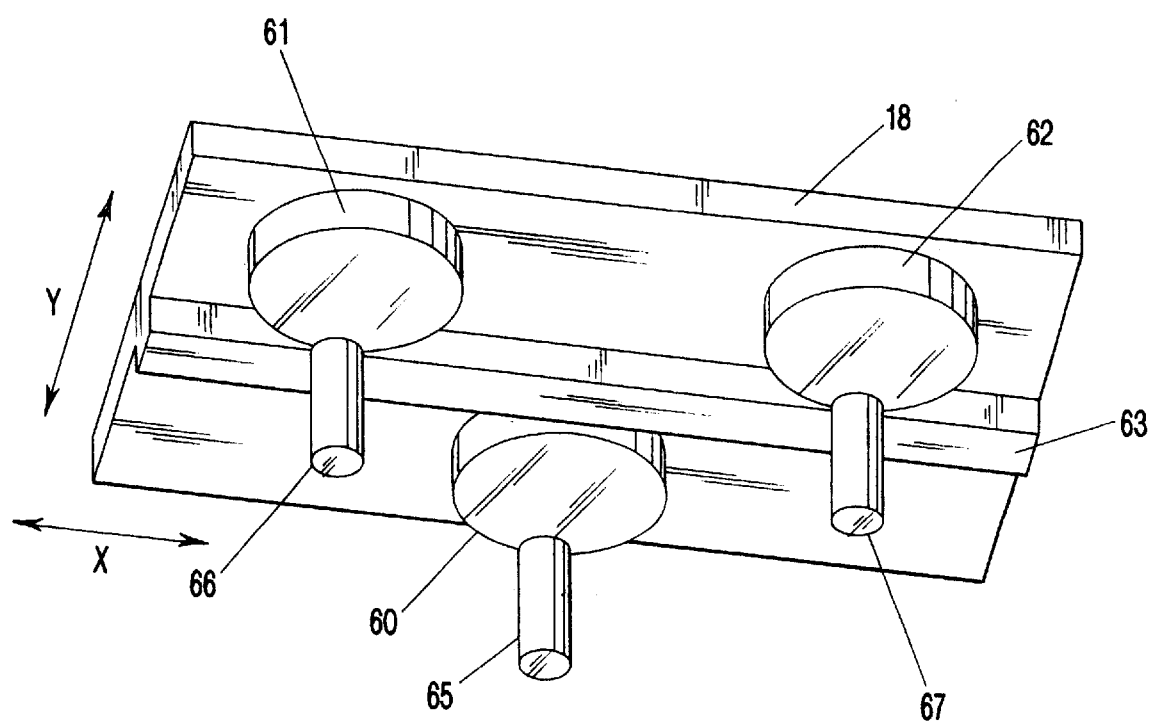
FIG. 14 shows a schematic isometric view of the bottom side of a sixth example of a planar X-Y mechanism. Only the drive mechanism for motion in the Y-axis is shown.

FIG. 14 shows a schematic isometric view of the bottom side of a sixth example of a planar X-Y mechanism. Eccentric disks 60, 61 and 62 are disposed beneath a generally planar, rectangular platform 18. Thus, the drive mechanisms are shielded or covered by the platform 18. In this example, three eccentric disks 60–62 are used per reference axis, i.e., one master disk 60 and two slave disks 61, 62 for the Y-axis. For the sake of simple illustration, FIG. 14 only shows the drive mechanism to impel motion in one direction (e.g. Y-axis). A second set of three disks (not shown) arranged in tandem with the disks 60–62, but in track channels oriented perpendicular to those shown in FIG. 14, could also be disposed under the platform. Stepper motors can be used to rotate the drivers 65, 66 and 67 in a coordinated fashion. Linear track 63 is attached to, or is an integral part of, the bottom side of platform 18, and is aligned parallel to the X-axis. The arrangement shown in FIG. 14 of disks 61 and 62 disposed on one side of track 63, and the third disk 60 disposed on the other side of track 63 affords a desirable kinematically constraining geometry. Coordinated rotation of disks 60, 61, and 62 produces smooth translational motion of platform 18 in the Y-axis.

If the disk drivers of the present invention are operated with constant rotational speed (e.g. rpm), then the velocity of the platform will vary continuously throughout a full rotation of the eccentric disks. The lowest platform velocity is achieved when the circumferential surfaces of the eccentric disks (or outer races) contact the sides 23–26 of platform 18 at their smallest and largest radial distance from axis of rotation. Then, platform velocity increases and obtains its maximum at 90 angular degrees from the earlier referenced position.

Figure 15:
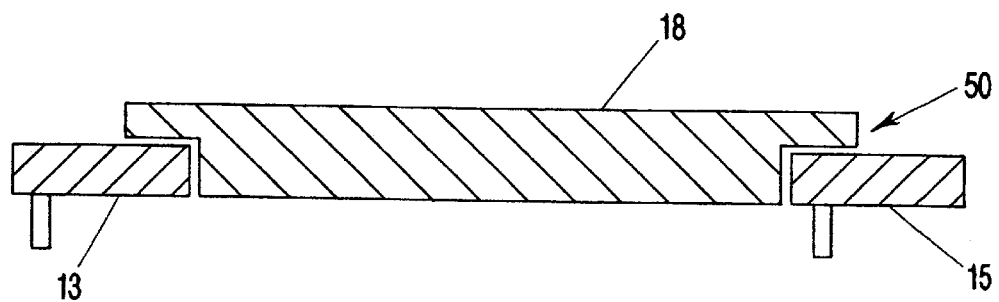
FIG. 15 shows a schematic side cross-section view of a seventh example of a planar X-Y mechanism, according to the present invention.

FIG. 15 shows a schematic side cross-section view of a seventh example of a planar X-Y mechanism, according to the present invention. Platform 18 has an overhanging lip 50, which partially shields disks 13 and 15. Platform 18 is supported by disks 13 and 15, which are operatively engaged with overhanging lip 50. Overhanging lip 50 is also illustrated in FIG. 11.

Figure 16:
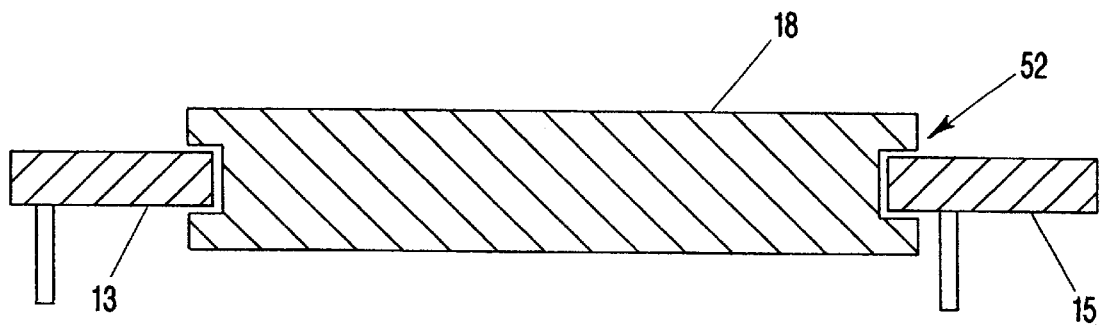
FIG. 16 shows a schematic side cross-section view of a eighth example of a planar X-Y mechanism, according to the present invention.

FIG. 16 shows a schematic side cross-section view of a eighth example of a planar X-Y mechanism, according to the present invention. Platform 18 has a flat-bottomed groove 52, which partially shields disks 13 and 15. Platform 18 is supported by disks 13 and 15, which are operatively engaged with flat-bottomed groove 52.

Figure 17:
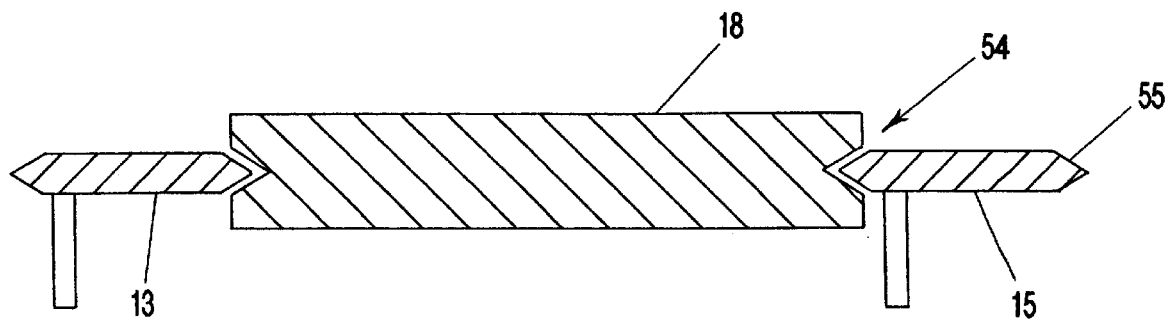
FIG. 17 shows a schematic side cross-section view of a ninth example of a planar X-Y mechanism, according to the present invention.

FIG. 17 shows a schematic side cross-section view of a ninth example of a planar X-Y mechanism, according to the present invention. Platform 18 has a V-shaped groove 54, which partially shields disks 13 and 15. Platform 18 is supported by disks 13 and 15, which are operatively engaged with V-shaped groove 54. Disks 13 and 15 have a mating V-shaped shape of their outer circumference 55.

Figure 18:
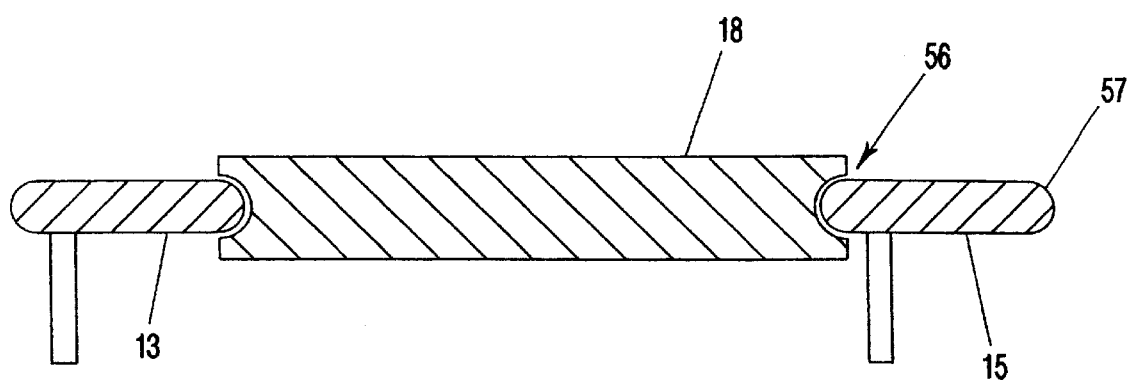
FIG. 18 shows a schematic side cross-section view of a tenth example of a planar X-Y mechanism, according to the present invention

FIG. 18 shows a schematic side cross-section view of a tenth example of a planar X-Y mechanism, according to the present invention. Platform 18 has a semi-circular groove 56, which partially shields disks 13 and 15. Platform 18 is supported by disks 13 and 15, which are operatively engaged with semi-circular groove 56. Disks 13 and 15 have a mating semi-circular shape of their outer circumference 57.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. For example, angle encoder means can be attached to each disk's axis of rotation and used to measure the angle of rotation of each disk. Also, platform 18 can be supported on plane 19 by a plurality of ball bearings attached to the support base to minimize sliding friction.

It is intended that the scope of the invention be defined by the claims appended hereto.

What is claimed is:

1. A bi-directional slide mechanism, comprising:

a base;

a platform, slidably supported on the base for bi-directional travel along a single linear axis of motion;

a master disk having a first circumference in contact with a first side of the platform, the master disk being rotatably mounted to the base for eccentric rotation about a first axis of rotation; wherein the first axis of rotation is oriented perpendicular to the single linear axis of travel and is oriented perpendicular to the base;

a slave disk having a second circumference in contact with an opposing second side of the platform, the slave disk being rotatably mounted to the base for eccentric rotation about a second axis of rotation; wherein the second axis of rotation is oriented perpendicular to the single linear axis of travel and is oriented perpendicular to the base;

driving means for rotating both the master and slave disks in the same rotational direction;

means for coordinating the rotation of both the master and slave disks for producing smooth, bi-directional travel of the platform along the single linear axis of motion;

first bearing means for reducing friction between the master disk and the first side of the platform during movement, comprising:

a first inner race in contact with the first circumference of the master disk;

a first outer race disposed concentrically about the first inner race; and a first plurality of bearings rollably disposed between the first inner race and the first outer race; and second bearing means for reducing friction between the master disk and the second side of the platform during movement, comprising:
  a second inner race in contact with the second circumference of the master disk;
  a second outer race disposed concentrically about the second inner race; and
  a second plurality of bearings rollably disposed between the second inner race and the second outer race.

2. The apparatus of claim 1, wherein the first and second bearing means comprise bearings selected from the group consisting of roller, needle, and ball bearings.

3. The apparatus of claim 1, further comprising means, attached to the base, for reducing sliding friction between the platform and the base, and for constraining the platform to move along the single linear axis of travel.

4. The apparatus of claim 3, wherein the means for reducing sliding friction between the platform and the base is selected from the group consisting of linear bearing guides and air bearing means.

5. The apparatus of claim 1, wherein both disks remain in contact with their respective sides of the platform, during bi-directional motion of the platform, to reduce problems with backlash.

6. The apparatus of claim 1, further comprising a linear rail protruding from the underside of the platform; the rail being oriented perpendicular to the single linear axis of motion; wherein the master disk contacts one side of rail, and the slave disk contacts the opposing side of the rail.

7. A bi-directional slide mechanism, comprising:
  a base;
  a platform, slidably supported on the base for bi-directional travel along a single linear axis of motion;
  a master disk having a first circumference in contact with a first side of the platform, the master disk being rotatably mounted to the base for eccentric rotation about a first axis of rotation; wherein the first axis of rotation is oriented perpendicular to the single linear axis of travel and is oriented perpendicular to the base;
  a slave disk having a second circumference in contact with an opposing second side of the platform, the slave disk being rotatably mounted to the base for eccentric rotation about a second axis of rotation; wherein the second axis of rotation is oriented perpendicular to the single linear axis of travel and is oriented perpendicular to the base;
  driving means for rotating both the master and slave disks in the same rotational direction; and
  means for coordinating the rotation of both the master and slave disks for producing smooth, bi-directional travel of the platform along the single linear axis of motion;
  wherein the driving means comprise:
    a first stepper motor attached to the master disk for rotating the master disk eccentrically about the first axis of rotation;
    a second stepper motor attached to the slave disk for rotating the slave disk eccentrically about the second axis of rotation; and
  wherein the means for coordinating the rotation of both the master and slave disk comprises means for electronically synchronizing the operation of the first and second stepper motors.

8. The apparatus of claim 7, wherein the master and slave disks have a shape selected from the group consisting of circular, elliptical, polygonal, lobed, multi-lobed, and oblong.

9. The apparatus of claim 7, wherein both the master and slave disks have a circular shape.

10. The apparatus of claim 9, wherein both the master and slave disks are circular and have the same diameter.

11. The apparatus of claim 10, wherein the means for coordinating the rotation of the master and slave disks comprises means for rotating both disks at essentially the same speed, and means for starting/stopping the rotation at essentially the same time.

12. The apparatus of claim 7, further comprising means for reducing sliding friction between a disk and a side of the platform during movement.

13. The apparatus of claim 7, further comprising means attached to the base for reducing sliding friction between the platform and the base, and for constraining the platform to move along the single axis of motion, without rotation of the platform.

14. The apparatus of claim 7, further comprising angle encoder means in operative association with a disk for measuring the angle of rotation of the disk about its axis of rotation.

15. A bi-directional slide mechanism, comprising:
  a base;
  a platform, slidably supported on the base for bi-directional travel along a single linear axis of motion;
  a master disk having a first circumference in contact with a first side of the platform, the master disk being rotatably mounted to the base for eccentric rotation about a first axis of rotation; wherein the first axis of rotation is oriented perpendicular to the single linear axis of travel and is oriented perpendicular to the base;
  a slave disk having a second circumference in contact with an opposing second side of the platform, the slave disk being rotatably mounted to the base for eccentric rotation about a second axis of rotation; wherein the second axis of rotation is oriented perpendicular to the single linear axis of travel and is oriented perpendicular to the base;
  driving means for rotating both the master and slave disks in the same rotational direction; and
  means for coordinating the rotation of both the master and slave disks for producing smooth, bi-directional travel of the platform along the single linear axis of motion;
  wherein both the master and slave disks and the platform are disposed in the same plane;
  wherein the apparatus is fabricated using MEMS technology; and
  wherein the size apparatus is sufficiently small to be able to be incorporated into a MEMS device.

16. The apparatus of claim 15, wherein the base comprises a pair of parallel guideways for constraining the platform to move along the single linear axis of travel.

17. A bi-directional slide mechanism, comprising:
  a base;
  a platform, slidably supported on the base for bi-directional travel along a single linear axis of motion;
  a master disk having a first circumference in contact with a first side of the platform, the master disk being rotatably mounted to the base for eccentric rotation about a first axis of rotation; wherein the first axis of rotation is oriented perpendicular to the single linear axis of travel and is oriented perpendicular to the base;
  a slave disk having a second circumference in contact with an opposing second side of the platform, the slave disk being rotatably mounted to the base for eccentric rotation about a second axis of rotation; wherein the second axis of rotation is oriented perpendicular to the single linear axis of travel and is oriented perpendicular to the base;

driving means for rotating both the master and slave disks in the same rotational direction; and means for coordinating the rotation of both the master and slave disks for producing smooth, bi-directional travel of the platform along the single linear axis of motion;

wherein the platform has a recessed volume disposed underneath the platform;

wherein both the master and slave disks are disposed within said recessed volume inboard of the outer perimeter of the platform; and wherein both the master and slave disks make contact with interior surfaces of the platform.

18. The apparatus of claim 17, wherein the driving means comprise:

a first stepper motor attached to the master disk for rotating the master disk eccentrically about the first axis of rotation; and a second stepper motor attached to the slave disk for rotating the slave disk eccentrically about the second axis of rotation;

wherein the means for coordinating the rotation of both the master and slave disk comprises means for electronically synchronizing the operation of the first and second stepper motors.

19. A bi-directional slide mechanism, comprising:

a base;

a platform, slidably supported on the base for bi-directional travel along a single linear axis of motion;

a master disk having a first circumference in contact with a first side of the platform, the master disk being rotatably mounted to the base for eccentric rotation about a first axis of rotation; wherein the first axis of rotation is oriented perpendicular to the single linear axis of travel and is oriented perpendicular to the base;

a slave disk having a second circumference in contact with an opposing second side of the platform, the slave disk being rotatably mounted to the base for eccentric rotation about a second axis of rotation; wherein the second axis of rotation is oriented perpendicular to the single linear axis of travel and is oriented perpendicular to the base;

driving means for rotating both the master and slave disks in the same rotational direction; and means for coordinating the rotation of both the master and slave disks for producing smooth, bi-directional travel of the platform along the single linear axis of motion;

wherein at least one side of the platform comprises a shape for engaging a disk having a corresponding mating shape; wherein said shape is selected from the group consisting of an overhanging lip, a flat-bottomed groove, a V-shaped groove, and a semicircular groove.

20. A bi-directional slide mechanism, comprising:

a base;

a platform, slidably supported on the base for bi-directional travel along a single linear axis of motion;

a master disk having a first circumference in contact with a first side of the platform, the master disk being rotatably mounted to the base for eccentric rotation about a first axis of rotation; wherein the first axis of rotation is oriented perpendicular to the single linear axis of travel and is oriented perpendicular to the base;

a slave disk having a second circumference in contact with an opposing second side of the platform, the slave disk being rotatably mounted to the base for eccentric rotation about a second axis of rotation; wherein the second axis of rotation is oriented perpendicular to the single linear axis of travel and is oriented perpendicular to the base;

driving means for rotating both the master and slave disks in the same rotational direction; and means for coordinating the rotation of both the master and slave disks for producing smooth, bi-directional travel of the platform along the single linear axis of motion;

wherein the means for coordinating the rotation of the master and slave disks comprises a circuitous mechanical linkage between the first and second axes of rotation selected from the group consisting of a drive belt, timing belt, drive chain, a gear train, a toothed timing belt, a flexible steel band, and an O-ring.

* * * * *